United States Patent

Katayama et al.

Patent Number: 5,683,627
Date of Patent: Nov. 4, 1997

[54] CURABLE ELECTROCONDUCTIVE COMPOSITION

[75] Inventors: Toshihiro Katayama; Tomomi Okamoto; Toshitsugu Shimamoto, all of Tokuyama, Japan

[73] Assignee: Tokuyama Corporation, Tokuyama, Japan

[21] Appl. No.: 596,918

[22] Filed: Mar. 13, 1996

[30] Foreign Application Priority Data

Mar. 15, 1995 [JP] Japan .................................. 7-056303

[51] Int. Cl.$^6$ .......................... H01B 1/22; C08G 59/20
[52] U.S. Cl. .................... 252/512; 523/457; 523/458; 528/103; 528/105
[58] Field of Search .......................... 252/512, 513, 252/514; 523/400, 457, 458; 528/103, 105

[56] References Cited

U.S. PATENT DOCUMENTS

| | | | |
|---|---|---|---|
| 4,652,398 | 3/1987 | Goswami et al. | 252/514 |
| 4,692,272 | 9/1987 | Goswami et al. | 252/514 |
| 4,962,162 | 10/1990 | Kosuda et al. | 525/422 |
| 5,204,025 | 4/1993 | Yamada et al. | 252/500 |

*Primary Examiner*—Douglas J. McGinty
*Assistant Examiner*—M. Kopec
*Attorney, Agent, or Firm*—Sherman and Shalloway

[57] ABSTRACT

A curable electroconductive composition which comprises (1)(a) a monoglycidyl compound such as cardanolglycidyl ether having 18 to 30 carbon atoms and further having in a molecule thereof an epoxy group, one or more aromatic hydrocarbon groups and an aliphatic hydrocarbon group having 6 to 20 carbon atoms and (b) a crosslinking component such as bisphenol A diglycidyl ether having in a molecule thereof two or more epoxy groups and one or more aromatic hydrocarbon groups, (2) a curing agent, and (3) a copper powder. The curable electroconductive composition does not develop cracks during the curing even when thick electrically conducting cured products are formed such as electrically conducting through-holes in printed wiring board, and the cured product thereof exhibits stable electrically conducting property over extended periods of time.

17 Claims, 1 Drawing Sheet

SUBSTRATE FOR EVALUATING THE FILLING

SUBSTRATE FOR EVALUATING THE FILLING

CROSS-SECTIONAL VIEW OF THE SUBSTRATE
FOR EVALUATING THE FILLING

CURABLE ELECTROCONDUCTIVE COMPOSITION

BACKGROUND OF THE INVENTION 1. (Field of the Invention)

The present invention relates to a novel curable electroconductive composition. More specifically, the invention relates to a curable electroconductive composition which does not develop cracks on curing and produces a cured product that stably exhibits electrically conducting property for extended periods of time, even when a thick electrically conducting cured product is produced (for example, when the curable composition is filled into a through-hole in a printed wiring board and is cured to form an electrically conducting through-hole).

2. (Description of the Prior Art)

The curable electroconductive compositions are used widely in the field of electronics, such as electrically conducting adhesives, electromagnetic shields, etc. In recent years, in particular, there has been proposed technology for forming electrically conducting through-holes, which have a high reliability, at a reduced cost by filling the through-holes with a curable electroconductive composition and curing the composition to form electrically conducting through-holes.

When the electrically conducting through-holes are produced by using the curable electroconductive composition, there is a problem that cracks are caused in the cured product due to internal stress caused by expansion or contraction of copper clad laminates on curing or on cooling after curing, or caused by shrinking on curing. That is, the curable electroconductive composition contains metal powder and a curable resin, and exhibits electrically conducting property as the metal powder comes into contact with each other upon curing and shrinking of the curable resin. Therefore, the curable electroconductive composition itself is cured and shrinked. Accordingly, the curable composition has a problem in that it develops cracks inside the cured product on curing or on cooling after curing. Even after cured, furthermore, the curable electroconductive composition develops cracks due to thermal shock caused by soldering at the time of mounting components, which is another problem.

In order to solve such problems, there have been proposed:

(1) A method of adding a plasticizer such as modified organosiloxane or the like to the curable electroconductive composition; and (2) A method of adding a long-chain aliphatic ester compound or ether compound having two or more glycidyl groups in a molecule thereof to the curable electroconductive composition (Japanese Laid-Open Patent Publication No. 173858/1992).

The curable electroconductive composition mentioned in (1) above exhibits desirable effects to some extent when it is used for forming circuit patterns, electrically conducting adhesives, electromagnetic shields, etc., but still leave room for improvement when it is desired to obtain a thick electrically conducting cured product such as when the through-holes are filled with the curable electroconductive composition to form electrically conducting through-holes because it develops cracks, easily caused by thermal shock at the time of curing. In order to prevent the above-mentioned phenomenon in forming the through-holes by using the plasticizer, it becomes necessary to add the plasticizer in very large amounts. This, however, causes the curable electroconductive composition to shrink insufficiently upon curing and, hence, causes the obtained cured product to exhibit decreased electrically conducting property.

According to the method mentioned in (2) above, the compound that exhibits reactivity can be added to the curable electroconductive composition without sacrificing the electrically conducting property of the cured product. With the glycidyl groups being present in a number of two or more, however, the compound after cured offers very small degree of freedom for the motion of the molecules. That is, this curable electroconductive composition exhibits effects to a sufficiently degree for forming circuit patterns but is not still capable of preventing the occurrence of cracks when it is filled and cured in the through-holes.

The present inventors therefore have attempted to blend an epoxy resin with a straight-chain alkylmonoglycidyl ether having 11 to 13 carbon atoms or a straight-chain alkyl-monoglycidyl ester having 9 to 11 carbon atoms (Japanese Laid-Open Patent Publication No. 184409/1994). By being blended with a compound having such straight-chain alkyl groups, it is made possible to prevent the occurrence of cracks to some extent.

In recent years, however, the traditional epoxy glass laminate has been replaced by a cheaply available phenolic paper laminate in order to decrease the cost of the printed wiring board. The phenolic paper laminate has a larger linear expansion coefficient than that of the epoxy glass laminate. When the through-holes are formed in the phenolic paper laminate and are filled with the curable electroconductive composition, therefore, the curable electroconductive composition receives expansion/contraction stress which is larger than that of the case of the traditional epoxy glass laminate, and cracks tend to develop more easily in the cured product.

The curable electroconductive composition containing the epoxy resin blended with the above-mentioned compound having straight-chain alkyl groups could not prevent the occurrence of cracks in the cured product to a satisfactory degree when it was applied to a substrate having a large linear expansion coefficient such as phenolic paper laminate.

In order to obtain a thick electrically conducting cured product, therefore, it has been desired to develop a curable electroconductive composition that does not cause cracks upon the curing, exhibits high degree of electrically conducting property over extended periods of time after it is cured, and does not cause cracks even when applied to the phenolic paper laminate having a large linear expansion coefficient.

SUMMARY OF THE INVENTION

The object of the present invention therefore is to provide a curable electroconductive composition which does not develop cracks on curing or cooling after curing even when a thick electrically conducting cured product is obtained therefrom.

Another object of the present invention is to provide a curable electroconductive composition which exhibits high degree of electrically conducting property over extended periods of time after it is cured.

A further object of the present invention is to provide a curable electroconductive composition which does not develop cracks when it is being cured or after it is cured and cooled even when it is applied to a substrate having a large linear expansion coefficient such as phenolic paper laminate.

The above-mentioned objects of the present invention are accomplished by a curable electroconductive composition that is described below.

A curable electroconductive composition which comprises:

(1) an epoxy resin containing (a) a monoglycidyl compound having 18 to 30 carbon atoms and further having in a molecule thereof one epoxy group, one or more aromatic hydrocarbon groups and an aliphatic hydrocarbon group having 6 to 20 carbon atoms, and (b) a crosslinking component having in a molecule thereof two or more epoxy groups and one or more aromatic hydrocarbon groups, the amount of the monoglycidyl compound being from 5 to 60 parts by weight per 100 parts by weight of the crosslinking component;

(2) a curing agent having a reactive group capable of reacting with said epoxy groups in said epoxy resin; and (3) a copper powder;

wherein said curing agent is blended in an amount of from 0.3 to 1.3 equivalents per equivalent of the epoxy groups in said epoxy resin as expressed in terms of the equivalents of the reactive groups capable of reacting with said epoxy groups in said epoxy resin, and said copper powder is blended in an amount of from 180 to 750 parts by weight per 100 parts by weight of a total of said epoxy resin and said curing agent.

One of the components contained in the curable electroconductive composition of the present invention is an epoxy resin that contains a particular monoglycidyl compound and a crosslinking component. The monoglycidyl compound contained in the epoxy resin has 18 to 30 carbon atoms and has in a molecule thereof an epoxy group, one or more aromatic hydrocarbon groups and an aliphatic hydrocarbon group having 6 to 20 carbon atoms.

It is important that the monoglycidyl compound has one epoxy group in the molecule thereof. When there is used a compound having two or more epoxy groups, then, this compound works as a crosslinking agent to decrease the degree of freedom of motion of the molecules; i.e., the effect for suppressing cracks is not exhibited to a sufficient degree. When there is used a compound without having epoxy group, then, this compound is not fixed in the cured product that is obtained upon the reaction with the curing agent and may elute out, which is not desirable.

It is further important that the monoglycidyl compound has in a molecule thereof one or more aromatic hydrocarbon groups and an aliphatic hydrocarbon group having 6 to 20 carbon atoms. By using a monoglycidyl compound having such particular groups, it is allowed to effectively prevent the occurrence of cracks during the curing or after cured and cooled even when the composition is used for a substrate having a large linear expansion coefficient such as phenolic paper laminate.

Though the function and mechanism for expressing such an effect are not obvious, the present inventors consider it in the following way. That is, the aromatic hydrocarbon group has a function for improving compatibility between an aromatic hydrocarbon group and a crosslinking agent having epoxy group as will be described later, whereas the aliphatic hydrocarbon group having 6 to 20 carbon atoms has a function for imparting flexibility to the cured product upon reacting with the curing agent as will be described later. It is then considered that these functions work together contributing to preventing the occurrence of cracks on curing and on cooling after curing.

The aromatic hydrocarbon group will be a monovalent or divalent group (phenyl group or phenylene group) derived from a benzene ring. Its number may be one or more in the monoglycidyl compound. In order that the aliphatic hydrocarbon group having 6 to 20 carbon atoms will not impair the effect for imparting flexibility to the cured product, however, the number of the aromatic hydrocarbon groups should be one or two.

The monoglycidyl compound must have carbon atoms in a number of from 18 to 30. When the number of carbon atoms is smaller than 18, the number of carbon atoms of the aliphatic hydrocarbon group contained in the monoglycidyl compound becomes smaller than 6, exhibiting decreased effect for imparting flexibility to the cured product. When the number of carbon atoms increases 30, on the other hand, the monoglycidyl compound becomes solid which exhibits decreased compatibility with other components that constitute the epoxy resin.

Representative examples of the monoglycidyl compound that can be preferably used in the present invention include a monoglycidyl ether and a monoglycidyl ester represented by the following formulas (1) and (2), respectively,

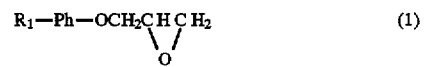  (1)

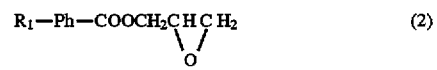  (2)

wherein $R_1$ is an aliphatic hydrocarbon group having 6 to 20 carbon atoms or a group that contains an aliphatic hydrocarbon group having 6 to 20 carbon atoms, and Ph is a phenylene group.

The aliphatic hydrocarbon group in $R_1$ may be either saturated or unsaturated or may have a straight chain or a branched chain. When the aliphatic hydrocarbon group is an unsaturated one, it is desired that unsaturated bonds are contained in a number of from 1 to 4.

Examples of the aliphatic hydrocarbon group having 6 to 20 carbon atoms include alkyl group, alkenyl group, alkadienyl group, alkatrienyl group and alkatetraenyl group.

An example of the group containing an aliphatic hydrocarbon group having 6 to 20 carbon atoms is an aralkyl group containing an alkylene group having 6 to 20 carbon atoms.

By blending the curable electroconductive composition with the above-mentioned monoglycidyl compound, the cured product obtained by heating and curing the curable electroconductive composition exhibits good electrically conducting property and sufficient flexibility. When the curable electroconductive composition is filled into a substrate having a large linear expansion coefficient such as phenolic paper laminate, therefore, the internal stress caused by a difference in the linear expansion coefficient from that of the substrate decreases at the time of heating and curing, suppressing the occurrence of cracks in the cured product.

Concrete examples of the monoglycidyl compound include as follows.

(i) compounds in which $R_1$ of the formula (1) is a saturated aliphatic hydrocarbon group;

nonylphenylmonoglycidyl ether laurylphenylmonoglycidyl ether, (iso)tridecylphenylmonoglycidyl ether, pentadecaphenylmonoglycidyl ether, (iso)stearylphenylmonoglycidyl ether, (ii) compounds in which $R_1$ of the formula (1) is an unsaturated hydrocarbon group;

3-(8',11',14'-pentadecatrienyl)phenylmonoglycidyl ether, 3-(8',11'-pentadecadienyl)phenylmonoglycidyl ether, 3-(8'-pentadecenyl)phenylmonoglycidyl ether, or cardanolglycidyl ether which is a mixture of the above three compounds and pentadecaphenylmonoglycidyl ether, 3-(6'-tetradecenyl)

phenylmonoglycidyl ether, 3-(4'-decenyl) phenylmonoglycidyl ether.

(iii) compounds in which $R_1$ of the formula (1) is an aromatic hydrocarbon group;

3-(8'-phenyl-t-octyl)phenylmonoglycidyl ether, 3-(4'-phenyl-n-hexyl)phenylmonoglycidyl ether.

(iv) compounds in which the glycidyl ethers of the above-mentioned compounds (i) to (iii) are replaced by the glycidyl esters.

These compounds may be used in a single kind or in a mixture of two or more kinds.

Among the above-mentioned monoglycidyl compounds, the compound in which $R_1$ is a saturated or unsaturated aliphatic hydrocarbon group having 9 to 20 carbon atoms is preferred since it is particularly effective in reducing the internal stress that is produced when the curable electroconductive composition blended with this compound is cured.

The epoxy resin used in the present invention contains a crosslinking component in addition to the above-mentioned monoglycidyl compound. As the crosslinking component, any known compound that is used as an epoxy resin can be used without any limitation having in a molecule two or more epoxy groups and one or more aromatic hydrocarbon groups. In general, a preferred compound has an epoxy group at both terminals of the molecule and has 1 to 4 phenyl groups.

In the present invention, the crosslinking component is preferably a bisphenol A diglycidyl ether having an epoxy equivalent of 170 to 200 g/equivalent, a bisphenol F diglycidyl ether having an epoxy equivalent of 156 to 200 g/equivalent, or a mixture thereof, from the standpoint of small water absorption, high crosslinking density when cured, and favorable electrically conducting property.

The above-mentioned epoxy equivalent is a value obtained by dividing the molecular weight by an equivalent number of the epoxy groups contained in the molecule.

In the present invention, the amount of the monoglycidyl compound must be within a range of from 5 to 60 parts by weight and, preferably, within a range of from 15 to 50 parts by weight per 100 parts by weight of the crosslinking component in order to prevent the cured product of the curable electroconductive composition from cracked and to prevent a drop in the electrically conducting property caused by a decrease in the crosslinking density of the crosslinking component in the epoxy resin.

In the present invention, a reactive diluent may be added as another component of the epoxy resin. The reactive diluent is in the form of a liquid of not larger than 100 cps at room temperature, has 1 to 2 epoxy groups, has a water solubility, defined as a solubility of when 10 parts by weight of the reactive diluent is dissolved in 90 parts by weight of water at room temperature, of not larger than 30%, and may, preferably, be a compound having 6 to 16 carbon atoms.

The reactive diluent is capable of not only decreasing the viscosity of the obtained curable electroconductive composition to improve handling property but also decreasing the amount of the solvent that is used, enabling the solvent to be easily volatilized at the time of curing and making it possible to decrease defects such as voids in the cured product that is obtained.

Concrete examples of the reactive diluent that can be favorably used in the present invention include alkylmonoglycidyl ether having 6 to 16 carbon atoms, alkylmonoglycidyl ester having 6 to 16 carbon atoms, 1,6-hexanedioldiglycidyl ether, phenylglycidyl ether, p-t-butylphenylglycidyl ether, diglycidyl adipate ester and the like.

Among these reactive diluents, the alkylmonoglycidyl ether having 6 to 16 carbon atoms and the alkylmonoglycidyl ester having 6 to 16 carbon atoms both have a long-chain alkyl group, cause the cured product obtained by heating and curing the curable electroconductive composition to which the reactive diluent is added to exhibit a β dispersion temperature of not higher than −50° and work to prevent the occurrence of cracks in the cured product caused by thermal shock in combination with the effect obtained by blending the monoglycidyl compound.

When the reactive diluent is to be used for accomplishing the above-mentioned object, the amount of its addition should be so determined as will not seriously impair the effects of the present invention. Concretely speaking, the reactive diluent is used in an amount of, preferably, from 10 to 60 parts by weight and, particularly preferably, from 20 to 50 parts by weight per 100 parts by weight of the crosslinking component from the standpoint of improving handling property by lowering the viscosity of the curable electroconductive composition and maintaining crosslinking density, i.e., from the standpoint of maintaining good electrically conducting property based upon the presence of a suitable amount of the crosslinking component.

In the present invention, the curing agent which is the second component may be any widely known curing agent for the epoxy resins without any limitation having a reactive group capable of reacting with epoxy groups in the above-mentioned epoxy resin. Examples of the reactive group that reacts with the epoxy groups in the epoxy resin will include amino group, carboxylic anhydride group, hydroxyl group and the like. Examples of the curing agent that can be favorably used for the present invention include amines such as metaphenylenediamine, diaminodiphenylmethane, diaminodiphenylsulfone, etc.; acid anhydrides such as phthalic anhydride, succinic anhydride, trimellitic anhydride, pyromellitic anhydride, tetrahydrophthalic anhydride, etc.; compound curing agents such as imidazoles, dicyandiamide, etc.; and resin curing agents such as phenol resin, polyamide resin, urea resin, etc. In particular, the novolak phenol resin or the novolak cresol resin is best suited as the curing agent for the present invention because of their excellent moistureproof property, heat resistance, reducing property, long pot life, suitable curing temperature for the printed wiring boards, and forming by-products that cause voids in very small amounts.

In order to obtain a favorable cured product, the above-mentioned curing agent must be blended, usually, in an amount of from 0.3 to 1.3 equivalents and, preferably, from 0.4 to 1.1 equivalents per equivalent of epoxy groups in the epoxy resin as expressed in terms of equivalents of the reactive groups that react with epoxy groups in the epoxy resin though the amount may vary to some extent depending upon the kind of the curing agent that is used.

When the curing agent is a novolak phenol resin or a novolak cresol resin,.in particular, it amount should be from 0.4 to 1.3 equivalents and, preferably, from 0.5 to 0.8 equivalents per equivalent of epoxy groups in the epoxy resin as expressed in terms of equivalents of hydroxyl groups.

In the present invention, though there is no particular limitation, it is desired that the copper powder has a purity of not lower than 99.99% from the standpoint of maintaining reliability of the electrically conducting through-holes that are formed. In order to maintain reliability in insulation among the through-holes, in particular, it is desired that the copper powder does not contain impurities such as silver or the like that could become a cause of migration.

It is further desired that the copper powder is a dendritic copper powder from the standpoint of accomplishing intimate adhesion to the epoxy resin and preventing the occurrence of cracks caused by the peeling on the interface between the copper powder and the binder. Owing to adjusting a particular particle size distribution and being combined with the above-mentioned epoxy resin, furthermore, the curable electroconductive composition are not cracked at the time of curing and the obtained cured product exhibits stable electrically conducting property over extended periods of time.

In the curable electroconductive composition of the present invention, furthermore, it is desired that the copper powder extracted from the curable electroconductive composition without substantially changing the property of the copper powder has an average particle diameter of from 2 to 20 μm and, preferably, from 5 to 15 μm, and has a tap density of from 1.0 to 3.3 g/cm$^3$ and, preferably, from 2.0 to 3.1 g/cm$^3$.

The copper powder is extracted from the curable electroconductive composition usually by selectively dissolving a curable resin that constitutes the curable electroconductive composition in a solvent, separating the copper powder by filtration, and extracting the copper powder with a solvent for 20 hours by the Soxhlet method.

So far, it has not been attempted to control properties of the copper powder in the curable electroconductive composition. Generally, the starting copper powder has simply been controlled for its tap density and average particle diameter. However, properties of the copper powder in the curable electroconductive composition that is practically obtained undergo a change due to the kneading with the curable resin. In the case of a dendritic copper powder having much branched moieties, in particular, the branched moieties are broken during the kneading, and average particle diameter and tap density change to a large extent. That is, simply controlling the properties of the starting copper powder is not enough for maintaining stable properties of the obtained curable electroconductive composition, and it becomes necessary to control the properties of the copper powder contained in the curable electroconductive composition, i.e., to control the properties of the copper powder extracted from the curable electroconductive composition.

When the tap density of the copper powder extracted from the curable electroconductive composition is larger than 3.3 g/cm$^3$ as described above, the branched moieties of the dendritic copper powder are broken to a considerable degree. That is, contacting points in the powder decrease, which makes it difficult to obtain good electrically conducting property after cured.

As described above, furthermore, the dendritic copper powder is broken during the kneading. Therefore, the tap density of the copper powder extracted from the curable electroconductive composition becomes higher than that of the starting copper powder. Accordingly, the lower limit of the tap density of the copper powder extracted from the curable electroconductive composition is 1.0 g/cm$^3$ even when it is kneaded according to a process for preparation that will be described later.

When the average particle diameter of the copper powder extracted from the curable electroconductive composition exceeds 20 μm, the curable electroconductive composition exhibits poor fluidity, causes the handling property to decrease, and permits copper powder having relatively large particle diameters to exist at a large proportion. Therefore, this tends to become a cause of cracks when the curable electroconductive composition is cured. In particular, when the through-holes in the printed wiring board are filled with the curable electroconductive composition which is then cured to obtain electrically conducting through-holes, the electrically conducting property tends to decrease at a large probability due to the development of cracks. Furthermore, the copper powder extracted from the curable electroconductive composition and having an average particle diameter of smaller than 2 μm tends to have excessively large surface areas and decreased resistance against oxidation.

It is further desired that the starting copper powder has an average particle diameter of from 5 to 20 μm. It is desired that the starting copper powder contains copper particles in excess of 40 μm at a ratio of not larger than 0.05% by volume and has a standard deviation log σ as defined by a logarithmic distribution function of from 0.20 to 0.26.

That is, the present inventors have studied the causes of cracks that occur in the curable electroconductive composition when it is being cured, and have discovered that cracks occur predominantly on the interface between the copper powder and the resin when a copper powder having a relatively large particle size is contained in the copper powder.

By limiting the sizes of large particles to be such that a standard deviation log σ as defined by a logarithmic distribution function is from 0.20 to 0.26 and by decreasing the ratio of the copper powder that has a particle diameter in excess of 40 μm, it is made possible to effectively prevent the occurrence of cracks caused by the curing and thermal shock of the curable electroconductive composition being assisted by the synergistic action of the aforementioned monoglycidyl compound.

The average particle diameter of the copper powder, standard deviation log σ defined the logarithmic distribution function and the rate of copper powder having particle diameter in excess of 40 μm, are measured by a laser-beam scattering method. That is, based upon the particle size distribution of the copper powder measured by the laser-beam scattering method, the standard deviation log σ as defined by the average particle diameter and the logarithmic distribution function and the ratio of copper powder of particle sizes in excess of 40 μm are calculated. In the present invention, the average particle diameter of the copper powder represents a volume average particle diameter.

There is no particular limitation in a process for producing dendritic copper powder having the above-mentioned particular average particle diameter and particle size distribution, that is used in the present invention. There can be favorably employed, for example, a wet-type classifier such as rake classifier, spiral classifier or liquid cyclone, or dry-type classifier such as sieve, rotary classifier, centrifugal classifier or air separator.

In order to obtain a curable electroconductive composition having both stable electrically conducting property and good handling property according to the present invention, the copper powder must be used in an amount of from 180 to 750 parts by weight and, preferably, from 200 to 570 parts by weight per 100 parts by weight of a total of the epoxy resin and the curing agent.

In producing the curable electroconductive composition of the present invention, the starting copper powder is homogeneously dispersed in the curable resin by kneading requiring a dispersing force which is just as weak as simply loosening the secondary cohesion of the dendritic copper powder.

As the kneading machine, there can be used a roll-type machine such as roll mill, Bumbury mixer, extruder or the like, a ball-type machine such as ball mill, sand grinder or the like, a wheel-type machine such as mix muller, multimill or the like, a blade-type machine such as kneader, screw mixer, zig-zag mixer, spiral mixer, planetary mixer, pony mixer or the like, as well as automatically mortar and a colloidal mill. Among them, when the kneading is effected using a machine that produces a strong kneading force such as roll-type machine, ball-type machine or wheel-type machine, the copper powder is subject to be broken and the obtained cured product may exhibit decreased electrically conducting property. When there is used a machine having a strong kneading force such as triple roll mill, therefore, it is desired that the roll is rotated at a decreased speed and a certain gap is maintained among the rolls, so that the composition passes through the rolls a decreased number of times.

It is therefore desired to knead the curable electroconductive composition by using the blade-type machine which has a relatively weak kneading force and, particularly preferably, by using a planetary mixer.

As required, the curable electroconductive composition of the present invention may be blended with a curing accelerator in addition to the curing agent. For instance, tertiary amines and imidazoles can be preferably used for the acid anhydride, dicyandiamide, phenol resin and aromatic amine. The curing accelerator is added in an amount of, preferably, from 0.1 to 5 parts by weight per 100 parts by weight of a total of the epoxy resin and the curing agent.

Though the curable electroconductive composition of the present invention does not require any particular solvent, it is allowable to add a suitable solvent to adjust the viscosity depending upon the applications. Any widely known solvent can be used without any particular limitation. For example, there can be used alcohols such as isopropanol, butanol or the like, esters such as ethyl acetate, butyl acetate or the like, or carbitols such as ethyl carbitol, butyl carbitol or the like. The above solvents may be used in a single kind or in a mixture of two or more kinds.

The curable electroconductive composition of the present invention may be blended with widely known additives in such amounts that do not seriously deteriorate the properties thereof. Examples of the additives include antifoaming agent, dispersing agent, thixotropy-imparting agent, leveling agent, rust-preventing agent, reducing agent and the like agents.

The curable electroconductive composition of the present invention can be applied, printed or filled by a widely known method such as spraying, brushing, dipping, offset printing or screen printing.

As will be understood from the foregoing description, the curable electroconductive composition of the present invention uses an epoxy resin that contains a particular monoglycidyl compound as an epoxy resin for constituting the curable electroconductive composition and, hence, exhibits excellent effect for preventing the occurrence of cracks during the curing or even when the cured product that is obtained is exposed to thermal shocks. Besides, the curable electroconductive composition of the invention after cured exhibits high degree of electrically conducting property over extended periods of time.

Owing to its properties as described above, therefore, the curable electroconductive composition of the present invention can be favorably used for forming relatively thick cured products such as being filled into the through-holes to exhibit high reliability.

EXAMPLES

The present invention will now be concretely described by way of Examples to which only, however, the invention is in no way limited.

Examples 1 to 4

Curable electroconductive compositions shown in Table 1 were prepared by using, as a monoglycidyl compound, a cardanolmonoglycidyl ether (tradename: Epicard, produced by Cashew Co.) represented by the following formula,

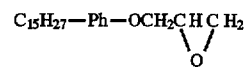

That is, the epoxy resin contained a monoglycidyl compound, a bisphenol A diglycidyl ether having an epoxy equivalent of 173 g/equivalent as a crosslinking component, and an n-undecylmonoglycidyl ether as a reactive diluent, which were blended at ratios as shown in Table 1. The epoxy resin was further blended with a novolak-type phenol resin having a hydroxyl equivalent of 105 g/equivalent as a curing agent in an amount of 46 parts by weight per 100 parts by weight of the bisphenol A diglycidyl ether, thereby to obtain a curable resin component. There was further added, as a curing accelerator, a 2-ethyl-4-methylimidazole in an amount of 1 part by weight per 100 parts by weight of the curable resin component. Furthermore, dendritic copper powders shown in Table 2 were treated for their surfaces with 1.0% by weight of an isopropyltristearoyl titanate. Among them, a dendritic copper powder A was selected and was blended at ratios shown in Table 1.

The compositions of the above-mentioned ratios were kneaded by using a planetary mixer under a condition of 40° C. for 120 minutes to obtain curable electroconductive compositions.

The average particle diameters and tap densities of the extracted copper powders of Table 2 were measured as described below. That is, part of the curable electroconductive composition in each of the Examples was dissolved in methyl ethyl ketone, filtered and, then, the copper powder was washed by the Soxhlet extraction method. The thus extracted copper powder was measured for each of the Examples, and their ranges of numerical values were recorded.

Figure 1:
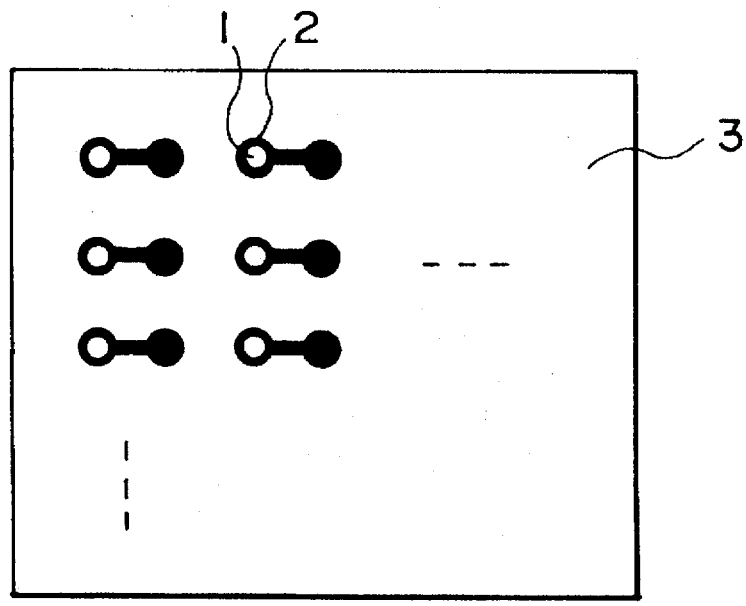
FIG. 1 is a plane view of a substrate for evaluating the curable electroconductive composition of the present invention.
Figure 2:
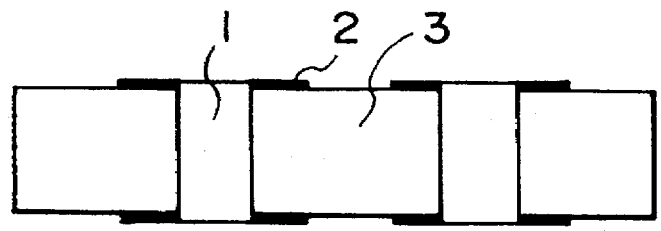
FIG. 2 is a cross-sectional view of the substrate of FIG. 1.

The obtained curable electroconductive compositions were evaluated in the following way. That is, through-holes having a diameter of 0.8 mm were perforated in a phenolic paper laminate having a thickness of 1.6 mm forming a test pattern as shown in FIGS. 1 and 2, and the through-holes were filled with the obtained curable electroconductive compositions by the screen printing method. The curable electroconductive compositions filling the through-holes were dried in a hot-air drying furnace at 50° C. for one hour, and were then cured under the condition of 180° C. for one hour.

After cured, resistances of the electrically conducting through-holes were measured using a digital multimeter to calculate average resistance of the through-holes. Those through-holes having resistances exceeding 200 mΩ/hole were counted as defective ones in the calculation of percent defective after cured. Furthermore, the through-hole resistance was expressed in an average value excluding the defective through-holes.

A thousand through-holes were observed for their sectional surfaces in each of the Examples and Comparative Examples. The sectional surfaces were observed using a stereomicroscope of a magnification of 40 times to calculate the rate of cracks.

In each of the Examples and Comparative Examples, furthermore, 10,000 through-holes were subjected to the thermal shock testing. The conditions of thermal testing consisted of −40° C. for 30 minutes and 100° C. for 30 minutes (vapor phase), that were repeated 100 times. After the thermal shock testing, the through-holes of which the resistances have increased by more than 30% were regarded to be defective ones to calculate percent defective.

The results were as shown in Table 1.

Example 5

A curable resin component was obtained by blending, as a monoglycidyl compound, the same cardanolmonoglycidyl ether as the one used in Example 1 in an amount of 35 parts by weight per 100 parts by weight of a bisphenol A diglycidyl ether having an epoxy equivalent of 173 g/equivalent, and, as a curing agent, a novolak-type phenol resin having a hydroxyl equivalent of 105 g/equivalent in an amount of 46 parts by weight per 100 parts by weight of the bisphenol A diglycidyl ether. The above curable resin component was further blended with the same curing accelerator and copper powder as those used in Examples 1 to 4, and with a suitable amount of DBE (tradename) which is an ester solvent produced by Du Pont Co. for adjusting the viscosity to prepare a curable electroconductive composition, and was evaluated in the same manner as in Examples 1 to 4. Here, in order to volatilize the solvent, the curable electroconductive composition charged into the through-holes was cured at 80° C. for 2 hours and, then, the temperature was raised to 180° C. at a rate of 1° C./minute, and was maintained at 180° C. for 60 minutes. Table 1 shows the results of evaluation.

Comparative Examples 1 and 2

Curable electroconductive compositions were prepared in the same manner as in Examples 1 to 4 but by changing the amount of the monoglycidyl compound that was blended, and were evaluated. The results were as shown in Table 1.

Examples 6 to 10

Curable electroconductive compositions were prepared in the same manner as in Example 3 but using, as the monoglycidyl compound, an isotridecylphenylmonoglycidyl ether (Example 6, molecular formula

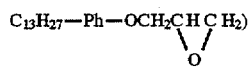

a ginkgolmonoglycidyl ether (=3-(8'-pentadecenyl) phenyl-monoglycidyl ether, Example 7, molecular formula

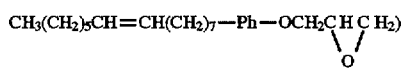

a nonylphenylmonoglycidyl ester (Example 8, molecular formula

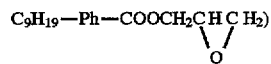

a pentadecaphenylmonoglycidyl ether (Example 9, molecular formula

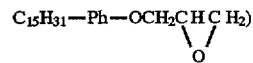

and a 3- (8', 11', 14'-pentadecatrienyl) phenyl-monoglycidyl ether (Example 10, molecular formula

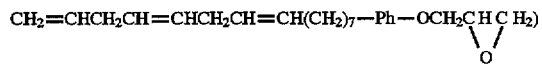

and were evaluated. The results were as shown in Table 1.

Examples 11 to 13

Curable electroconductive compositions were prepared in the same manner as in Example 3 but using, as a reactive diluent, an n-tridecylmonoglycidyl ether (Example 11, molecular formula

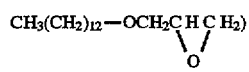

an n-nonylmonoglycidyl ether (Example 12, molecular formula

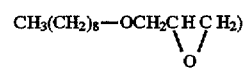

and an n-undecylmonoglycidyl ester (Example 13, molecular formula

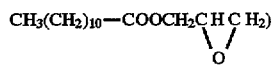

and were evaluated. The results were as shown in Table 1.

Comparative Example 3 and Examples 14, 15

Curable electroconductive compositions were prepared in the same manner as in Example 3 but using the dendritic copper powder denoted by B in Table 2 and blending the copper powder at ratios shown in Table 1, and were evaluated. The results were as shown in Table 1.

Examples 16, 17 and Comparative Example 4

Curable electroconductive compositions were prepared in the same manner as in Example 3 but using the dendritic copper powder denoted by C in Table 2 and blending the copper powder at ratios shown in Table 1, and were evaluated. The results were as shown in Table 1.

TABLE 1

| No. | Curable electroconductive composition ||||||| Evaluation of curable electroconductive composition ||||
|---|---|---|---|---|---|---|---|---|---|---|---|
| | Copper powder || Monoglycidyl compound || Reactive diluent || Curing Agent | Average through-hole resistance (*mΩ/hole) | Percent defective after cured (%) | Rate of cracks (%) | Percent defective after heat shock (%) |
| | Kind | Parts by wt.* | Kind | Parts by wt.** | Kind | Parts by wt.** | Equivalent*** | | | | |
| Ex. 1 | A | 360 | *1 | 15 | *7 | 35 | 0.57 | 12 | 0 | 0 | 0 |
| Ex. 2 | A | 360 | *1 | 20 | *7 | 35 | 0.57 | 8 | 0 | 0 | 0 |
| Ex. 3 | A | 360 | *1 | 35 | *7 | 35 | 0.55 | 10 | 0 | 0 | 0 |
| Ex. 4 | A | 360 | *1 | 50 | *7 | 35 | 0.53 | 20 | 0 | 0 | 0 |
| C. Ex. 1 | A | 360 | — | 0 | *7 | 35 | 0.60 | 12 | 15 | 100 | 60 |
| C. Ex. 2 | A | 360 | *1 | 70 | *7 | 35 | 0.50 | 110 | 0 | 0 | 35 |
| Ex. 5 | A | 360 | *1 | 35 | — | 0 | 0.67 | 31 | 0 | 0 | 0 |
| Ex. 6 | A | 360 | *2 | 35 | *7 | 35 | 0.54 | 12 | 0 | 0 | 0 |
| Ex. 7 | A | 360 | *3 | 35 | *7 | 35 | 0.54 | 9 | 0 | 0 | 0 |
| Ex. 8 | A | 360 | *4 | 35 | *7 | 35 | 0.53 | 18 | 0 | 0 | 0 |
| Ex. 9 | A | 360 | *5 | 35 | *7 | 35 | 0.54 | 16 | 0 | 0 | 0 |
| Ex. 10 | A | 360 | *6 | 35 | *7 | 35 | 0.54 | 13 | 0 | 0 | 0 |
| Ex. 11 | A | 360 | *1 | 35 | *8 | 35 | 0.56 | 21 | 0 | 0 | 0 |
| Ex. 12 | A | 360 | *1 | 35 | *9 | 35 | 0.53 | 11 | 0 | 0 | 0 |
| Ex. 13 | A | 360 | *1 | 35 | *10 | 35 | 0.56 | 24 | 0 | 0 | 0 |
| C. Ex. 3 | B | 150 | *1 | 35 | *7 | 35 | 0.55 | 140 | 14 | 7 | 74 |
| Ex. 14 | B | 230 | *1 | 35 | *7 | 35 | 0.55 | 35 | 0 | 0 | 0 |
| Ex. 15 | B | 300 | *1 | 35 | *7 | 35 | 0.55 | 11 | 0 | 0 | 0 |
| Ex. 16 | C | 550 | *1 | 35 | *7 | 35 | 0.55 | 8 | 0 | 0 | 0 |
| Ex. 17 | C | 650 | *1 | 35 | *7 | 35 | 0.55 | 87 | 0 | 0 | 0 |
| C. Ex. 4 | C | 800 | *1 | 35 | *7 | 35 | 0.55 | 146 | 65 | 44 | 78 |

*: Parts by wt. per 100 parts by wt. of curable resin component.
**: Parts by wt. Per 100 parts by wt. of crosslinking component.
***: Equivalents per equivalent of epoxy resin (expressed as equivalent of reactive groups that react with epoxy groups)
*1: Cardanolmonoglycidyl ether
*2: Isotridecylphenylmonoglycidyl ether
*3: Ginkgolmonoglycidyl ether
*4: Nonyl phenylmonoglycidyl ester
*5: Pentadecaphenylmonoglycidyl ether
*6: 3-(8',11',14'-pentadecatrienyl)phenylmonoglycidyl ether
*7: n-Undecylmonoglycidyl ether (viscosity at room temperature: 5 cps, water solubility: <20%)
*8: n-Tridecylmonoglycidyl ether (viscosity at room temperature: 7 cps, water solubility: <20%)
*9: n-Nonylmonoglycidyl ether (viscosity at room temperature: 4 cps, water solubility: <20%)
*10: n-Undecylmonoglycidyl ester (viscosity at room temperature: 16 cps, water solubility: <20%)

TABLE 2

| | Starting copper powder ||| Extracted copper powder ||
|---|---|---|---|---|---|
| Copper powder | Average particle diameter (μm) | *Large-diameter copper powder (% by vol.) | log σ | Average particle diameter (μm) | Tap density (g/cm³) |
| A | 10.2 | 0.01 | 0.20 | 9.2–9.9 | 2.91–3.02 |
| B | 13.1 | 0.03 | 0.24 | 12.2–12.5 | 2.19–2.21 |
| C | 9.6 | 0.01 | 0.21 | 8.7–9.0 | 3.07–3.08 |

*: Large-diameter copper powder stand for the one having particle diameters not smaller than 40 μm.

We claim:

1. A curable electroconductive composition which comprises:

(1) an epoxy resin containing (a) a monoglycidyl compound having 18 to 30 carbon atoms and further having in a molecule thereof an epoxy group, one or more aromatic hydrocarbon groups and an aliphatic hydrocarbon group having 6 to 20 carbon atoms, and (b) a crosslinking component having in a molecule thereof two or more epoxy groups and one or more aromatic hydrocarbon groups, the amount of the monoglycidyl compound being from 5 to 60 parts by weight per 100 parts by weight of the crosslinking component;

(2) a curing agent having a reactive group capable of reacting with said epoxy groups in said epoxy resin; and (3) a copper powder;

wherein said curing agent is blended in an amount of from 0.3 to 1.3 equivalents per equivalent of the epoxy groups in said epoxy resin as expressed in terms of the equivalents of the reactive groups capable of reacting with said epoxy groups in said epoxy resin, and said copper powder is blended in an amount of from 180 to 750 parts by weight per 100 parts by weight of a total of said epoxy resin and said curing agent.

2. A curable electroconductive composition according to claim 1, wherein the monoglycidyl compound is a monoglycidyl ether represented by the following formula,

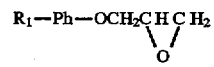

wherein $R_1$ is an aliphatic hydrocarbon group having 6 to 20 carbon atoms or a group containing an aliphatic hydrocarbon group having 6 to 20 carbon atoms, and Ph is a phenylene group.

3. A curable electroconductive composition according to claim 1, wherein the monoglycidyl compound is a monoglycidyl ester represented by the following formula,

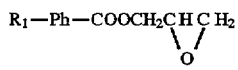

wherein $R_1$ is an aliphatic hydrocarbon group having 6 to 20 carbon atoms or a group containing an aliphatic hydrocarbon group having 6 to 20 carbon atoms, and Ph is a phenylene group.

4. A curable electroconductive composition according to claim 2 or 3, wherein the aliphatic hydrocarbon group is an alkyl group having 9 to 20 carbon atoms, an alkenyl group, an alkadienyl group, an alkatrienyl group or an alkatetraenyl group.

5. A curable electroconductive composition according to claim 1, wherein the crosslinking component is selected from the group consisting of bisphenol A diglycidyl ether having an epoxy equivalent of 170 to 200 g/equivalent, a bisphenol F diglycidyl ether having an epoxy equivalent of 156 to 200 g/equivalent, or mixtures thereof.

6. A curable electroconductive composition according to claim 1, wherein the monoglycidyl compound is contained in an amount of from 15 to 50 parts by weight per 100 parts by weight of the crosslinking component.

7. A curable electroconductive composition according to claim 1, wherein the epoxy resin contains, as a reactive diluent, a compound which is a liquid of not larger than 100 cps at room temperature, has 1 to 2 epoxy groups, has a water solubility of not larger than 30%, and has 6 to 16 carbon atoms.

8. A curable electroconductive composition according to claim 7, wherein the reactive diluent is selected from the group consisting of alkyl monoglycidyl ether having 6 to 16 carbon atoms, or mixtures thereof an alkylmonoglycidyl ester having 6 to 16 carbon atoms.

9. A curable electroconductive composition according to claim 7, wherein the reactive diluent is contained in an amount over a range of from 10 to 60 parts by weight per 100 parts by weight of the crosslinking component.

10. A curable electroconductive composition according to claim 7, wherein the reactive diluent is contained in an amount over a range of from 20 to 50 parts by weight per 100 parts by weight of the crosslinking component.

11. A curable electroconductive composition according to claim 1, wherein the curing agent is a novolak phenol resin or a novolak cresol resin.

12. A curable electroconductive composition according to claim 1, wherein the curing agent is blended in an amount of from 0.4 to 1.1 equivalents per equivalent of epoxy groups of the epoxy resin as expressed in terms of equivalents of the reactive groups that react with the epoxy groups in the epoxy resin.

13. A curable electroconductive composition according to claim 1, wherein the copper powder is in a dendritic form.

14. A curable electroconductive composition according to claim 1, wherein the copper powder extracted from said curable electroconductive composition has an average particle diameter of from 2 to 20 μm and a tap density of from 1.0 to 3.3 g/cm$^3$.

15. A curable electroconductive composition according to claim 1, wherein the copper powder extracted from said curable electroconductive composition has an average particle diameter of from 5 to 15 μm and a tap density of from 2.0 to 3.1 g/cm$^3$ in a state of being extracted from the curable electroconductive composition without being substantially changed.

16. A curable electroconductive composition according to claim 1, wherein the copper powder has an average particle diameter of from 5 to 20 μm, contains particles in excess of 40 μm at a ratio which is not larger than 0.05% by volume, and has a standard deviation (log σ) as defined by a logarithmic distribution function of from 0.20 to 0.26 before being mixed with other components.

17. A curable electroconductive composition according to claim 1, wherein the copper powder is blended in an amount of from 200 to 570 parts by weight per 100 parts by weight of a total of the epoxy resin and the curing agent.

* * * * *